United States Patent
Yuan et al.

(10) Patent No.: US 9,502,517 B2
(45) Date of Patent: Nov. 22, 2016

(54) ARRAY SUBSTRATE AND FABRICATION METHOD THEREOF, AND DISPLAY DEVICE

(71) Applicant: BOE TECHNOLOGY GROUP CO., LTD., Beijing (CN)

(72) Inventors: Guangcai Yuan, Beijing (CN); Dongfang Wang, Beijing (CN); Jun Cheng, Beijing (CN); Xiangyong Kong, Beijing (CN); Ce Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/430,095

(22) PCT Filed: May 30, 2014

(86) PCT No.: PCT/CN2014/078891
§ 371 (c)(1),
(2) Date: Mar. 20, 2015

(87) PCT Pub. No.: WO2015/100935
PCT Pub. Date: Jul. 9, 2015

(65) Prior Publication Data
US 2016/0027887 A1    Jan. 28, 2016

(30) Foreign Application Priority Data
Jan. 3, 2014    (CN) .......................... 2014 1 0003674

(51) Int. Cl.
*H01L 29/24*    (2006.01)
*H01L 29/423*    (2006.01)
(Continued)

(52) U.S. Cl.
CPC ....... *H01L 29/42384* (2013.01); *H01L 27/124* (2013.01); *H01L 27/1225* (2013.01); *H01L 27/1285* (2013.01); *H01L 27/1288* (2013.01);
(Continued)

(58) Field of Classification Search
CPC ............. H01L 29/24; H01L 29/42384; H01L 27/1225
USPC .......................................... 438/104
See application file for complete search history.

(56) References Cited

U.S. PATENT DOCUMENTS 8,304,776 B2 * 11/2012 Nam ..................... H01L 27/124
257/291

FOREIGN PATENT DOCUMENTS

CN    101656232 A    2/2010
CN    101840084 A    9/2010
(Continued)

OTHER PUBLICATIONS

Oct. 27, 2015—(CN)—First Office Action Appn 201410003674.7 with English Tran.
Oct. 10, 2014 (CN) International Search Report and Written Opinion for PCT/CN2014/078891.
Oct. 10, 2014 (CN) Written Opinion for PCT/CN2014/078891—Eng Tran.
Mar. 22, 2016—(CN)—Second Office Action Appn 201410003674.7 with English Tran.

*Primary Examiner* — Tran Tran
(74) *Attorney, Agent, or Firm* — Banner & Witcoff, Ltd.

(57) ABSTRACT

A display device, an array substrate and a fabrication method thereof are provided. The array substrate comprises a data line and a gate line, the data line and the gate line intersect with each other to define a pixel region. The pixel region comprises a first thin film transistor and a pixel electrode. The fabrication method comprises: forming an active layer film and a source-drain metal layer on a substrate, and forming an active layer, a source electrode and a drain electrode of the first thin film transistor on the substrate by a single patterning process.

20 Claims, 4 Drawing Sheets

(51) Int. Cl.
  *H01L 27/12* (2006.01)
  *H01L 29/51* (2006.01)
  *H01L 29/786* (2006.01)

(52) U.S. Cl.
  CPC ............. *H01L 29/24* (2013.01); *H01L 29/513* (2013.01); *H01L 29/517* (2013.01); *H01L 29/518* (2013.01); *H01L 29/7869* (2013.01); *H01L 29/78606* (2013.01); *H01L 29/78696* (2013.01); *H01L 2029/42388* (2013.01)

(56) References Cited

FOREIGN PATENT DOCUMENTS

| | | |
|---|---|---|
| CN | 102629046 A | 8/2012 |
| CN | 103123910 A | 5/2013 |
| CN | 103489874 A | 1/2014 |
| CN | 103745978 A | 4/2014 |

* cited by examiner

ARRAY SUBSTRATE AND FABRICATION METHOD THEREOF, AND DISPLAY DEVICE

The application is a U.S. National Phase Entry of International Application No. PCT/CN2014/078891 filed on May 30, 2014, designating the United States of America and claiming priority to Chinese Patent Application No. 201410003674.7 filed on Jan. 3, 2014. The present application claims priority to and the benefit of the above-identified applications and the above-identified applications are incorporated by reference herein in their entirety.

TECHNICAL FIELD

Embodiments of the disclosure relate to an array substrate and a fabrication method thereof, and a display device.

BACKGROUND

Recently, display technology develops rapidly. Thin film transistor serving as a switch component is evolving from an original amorphous silicon (a-Si) thin film transistor to current low-temperature polycrystalline silicon (LTPS) thin film transistor, metal-induced lateral crystallization (MILC) thin film transistor, Oxide thin film transistor and the like. Display device is evolving from original liquid crystal display (LCD) and plasma display panel (PDP) to current organic light-emitting diode (OLED) display, active matrix organic light-emitting diode (AMOLED) display and the like. The OLED display is a new generation of the display device; and compared with the liquid crystal display, the OLED display has many advantages such as self-luminescence, quick response, wide viewing angle, suitable for flexible display, suitable for transparent display, suitable for three-dimensional (3D) display and the like. However, both the liquid crystal display and the OLED display needs to equip each pixel with a switch for controlling the pixel, i.e., thin film transistor, such that a driving circuit independently controls each pixel without causing influences such as crosstalk on other pixels.

The oxide thin film transistor which is widely used adopts an oxide semiconductor as an active layer, has the characteristics of high mobility, high ON state current, better switching performance, better uniformity and the like, and is suitable for display device requiring quick response and large current, such as high-frequency, high-resolution and large-sized displays and organic light-emitting displays.

A fabrication process of the oxide thin film transistor generally requires six patterning processes to form a gate line and a gate electrode, a gate insulating layer, the active layer, an etching barrier layer, a source electrode and a drain electrode, a passivation layer and a via hole. However, the six patterning processes cause disadvantages such as instable performance, long fabrication cycle and increased fabrication cost.

SUMMARY

According to the embodiments of the disclosure, a fabrication method of an array substrate is provided. The array substrate comprises a data line and a gate line, the data line and the gate line intersect with each other to define a pixel region, and the pixel region comprises a first thin film transistor and a pixel electrode. The method comprises: forming an active layer film and a source-drain metal layer on a substrate, and forming an active layer, a source electrode and a drain electrode of the first thin film transistor by a single patterning process.

For example, the array substrate further comprises a second thin film transistor and a power line, and the active layers, the source electrodes and the drain electrodes of the first thin film transistor and the second thin film transistor are formed by the single patterning process.

For example, after forming the active layers, the source electrodes and the drain electrodes of the first thin film transistor and the second thin film transistor, the method further comprises: forming a gate insulating layer on the substrate and forming a via hole in the gate insulating layer; and forming gate electrodes of the first thin film transistor and the second thin film transistor, the gate line and the pixel electrode by a single patterning process.

For example, the forming the active layers, the source electrodes and the drain electrodes of the first thin film transistor and the second thin film transistor by the single patterning process comprises: coating a photoresist on the source-drain metal layer; exposing and developing by using a dual-tone mask, wherein a connection region of the drain electrode of the first thin film transistor and the gate electrode of the second thin film transistor, regions of the data line and the power line, and regions of the source electrodes and the drain electrodes of the first thin film transistor and the second thin film transistor are photoresist-completely-reserved regions, a first channel region of the first thin film transistor and a second channel region of the second thin film transistor are photoresist-partially-reserved regions, and regions other than the above regions are photoresist-completely-removed regions; removing the source-drain metal layer and the active layer film corresponding to the photoresist-completely-removed regions by a first etching process; removing the photoresist corresponding to the photoresist-partially-reserved-regions by an ashing process, and forming the first channel region and the second channel region; removing the source-drain metal layer corresponding to the photoresist-partially-reserved regions by a second etching process; and stripping remaining photoresist, and forming a pattern of the connection region of the drain electrode of the first thin film transistor and the gate electrode of the second thin film transistor, the data line and the power line, the source electrodes and the drain electrodes of the first thin film transistor and the second thin film transistor.

For example, the gate insulating layer is processed by an annealing process.

For example, the gate insulating layer is of a single-layer structure, and the gate insulating layer is made of one of silicon oxide thin film, aluminum oxide thin film, titanium oxide thin film, silicon oxynitride thin film, zirconium oxide thin film, tantalum oxide thin film, barium titanate thin film, neodymium oxide thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; or the gate insulating layer is of a dual-layer structure, that is, the gate insulating layer comprises a first gate insulating layer and a second gate insulating layer; the first gate insulating layer is positioned in proximity to a gate electrode layer, and the second gate insulating layer is positioned in proximity to the active layer; the first gate insulating layer is made of one of silicon oxynitride thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; and the second gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film; or the gate insulating layer is of a triple-layer structure, that is, the gate insulating layer comprises a third gate insulating layer, a fourth gate insulating layer and a fifth gate insulating layer; the third gate insulating layer is positioned in proximity to the gate electrode layer, the fifth gate insulating layer is positioned in proximity to the active layer, and the fourth gate insulating layer is positioned between the third gate insulating layer and the fifth gate insulating layer; the third gate insulating layer is made of one of silicon nitride thin film, aluminum nitride thin film, zirconium nitride thin film and tantalum nitride thin film; the fourth gate insulating layer is made of one of silicon oxynitride thin film, aluminum oxynitride thin film, zirconium oxynitride thin film, tantalum oxynitride thin film and neodymium oxynitride thin film; and the fifth gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film.

For example, the active layer comprises an intrinsic semiconductor layer and/or a doped semiconductor layer; the intrinsic semiconductor layer is made of one or more of IGZO, ITZO, IZO, $Cu_2O$, GZO, AZO, HfIZO and ZnON; and the doped semiconductor layer is made of one or more of amorphous silicon, polycrystalline silicon and microcrystalline silicon.

For example, in the case that the active layer is made of an oxide semiconductor layer, the oxide semiconductor layer is plasma-processed under different atmospheres.

For example, in the case that the active layer is made of an oxide semiconductor layer, the oxide semiconductor layer is annealed under nitrogen, oxygen or air.

For example, an annealing temperature is 200° C. to 500° C.

For example, a source-drain protective layer is further provided on the source electrode and the drain electrode, and the source-drain protective layer, the source electrode, the drain electrode and the active layer are formed by the single patterning process.

For example, the forming the gate electrodes and the pixel electrode by the single patterning process comprises: sequentially forming a metal material layer and a transparent electrode material layer on the substrate having the gate insulating layer, and forming the gate electrodes of the first thin film transistor and the second thin film transistor, the gate line and the pixel electrode by a patterning process.

For example, the method further comprises: forming a buffer layer on the substrate before forming the active layer, the source electrode and the drain electrode of the first thin film transistor.

According to the embodiments of the disclosure, an array substrate is provided. The array substrate is fabricated by using the fabrication method as described above. The array substrate comprises a substrate, and an active layer, a source electrode and a drain electrode, a gate insulating layer, a pixel electrode and a gate electrode which are formed on the substrate. The active layer, the source electrode and the drain electrode are formed by a single patterning process.

For example, the gate electrode comprises a first gate electrode of a first thin film transistor and a second gate electrode of a second thin film transistor; the active layer comprises a first active layer of the thin film transistor and a second active layer of the second thin film transistor; the source electrode and the drain electrode comprise a first source electrode and a first drain electrode of the first thin film transistor and a second source electrode and a second drain electrode of the second thin film transistor.

For example, the gate insulating layer is processed by an annealing process.

For example, the gate insulating layer is of a single-layer structure, and the gate insulating layer is made of one of silicon oxide thin film, aluminum oxide thin film, titanium oxide thin film, silicon oxynitride thin film, zirconium oxide thin film, tantalum oxide thin film, barium titanate thin film, neodymium oxide thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; or the gate insulating layer is of a dual-layer structure, that is, the gate insulating layer comprises a first gate insulating layer and a second gate insulating layer; the first gate insulating layer is positioned in proximity to a gate electrode layer, and the second gate insulating layer is positioned in proximity to the active layer; the first gate insulating layer is made of one of silicon oxynitride thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; and the second gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film; or the gate insulating layer is of a triple-layer structure, that is, the gate insulating layer comprises a third gate insulating layer, a fourth gate insulating layer and a fifth gate insulating layer; the third gate insulating layer is positioned in proximity to the gate electrode layer, the fifth gate insulating layer is positioned in proximity to the active layer, and the fourth gate insulating layer is positioned between the third gate insulating layer and the fifth gate insulating layer; the third gate insulating layer is made of one of silicon nitride thin film, aluminum nitride thin film, zirconium nitride thin film and tantalum nitride thin film; the fourth gate insulating layer is made of one of silicon oxynitride thin film, aluminum oxynitride thin film, zirconium oxynitride thin film, tantalum oxynitride thin film and neodymium oxynitride thin film; and the fifth gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film.

For example, the active layer comprises an intrinsic semiconductor layer and/or a doped semiconductor layer; the intrinsic semiconductor layer is made of one or more of IGZO, ITZO, IZO, $Cu_2O$, GZO, AZO, HfIZO and ZnON; and the doped semiconductor layer is made of one or more of amorphous silicon, polycrystalline silicon and microcrystalline silicon.

For example, a source-drain protective layer is further provided on the source electrode and the drain electrode.

For example, a buffer layer is further provided under the active layer.

According to the embodiments of the disclosure, a display device is provided. The display device comprises the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the disclosure provide a fabrication method of an array substrate. The array substrate comprises a gate line and a data line, and a first thin film transistor and a pixel electrode are provided in a pixel region defined by intersecting the gate line with the data line. The fabrication method of the array substrate comprises: forming an active layer, a source electrode and a drain electrode of the first thin film transistor on the substrate by a single patterning process.

The active layer, the source electrode and the drain electrode are formed by the single patterning process, thus the fabrication period of the thin film transistor is greatly shortened. Because less fabrication processes are applied on the thin film transistor, the performances of the thin film transistor are greatly improved, and a relatively large drift of a threshold voltage of the thin film transistor will not occur. In addition, the yield is improved, and the thin film transistor is more suitable for long-term use due to its stability and reliability.

The fabrication method of the array substrate according to the embodiments of the disclosure is applicable to fabricating the array substrate of a LCD of top gate type, and is also applicable to fabricating the array substrate of a top emission Organic Light-emitting Diode (OLED) display of top gate type.

Hereinafter, the fabrication method of the array substrate according to the embodiments of the disclosure is described with the array substrate of the OLED display as an example in conjunction with the accompanying drawings.

Figure 8:
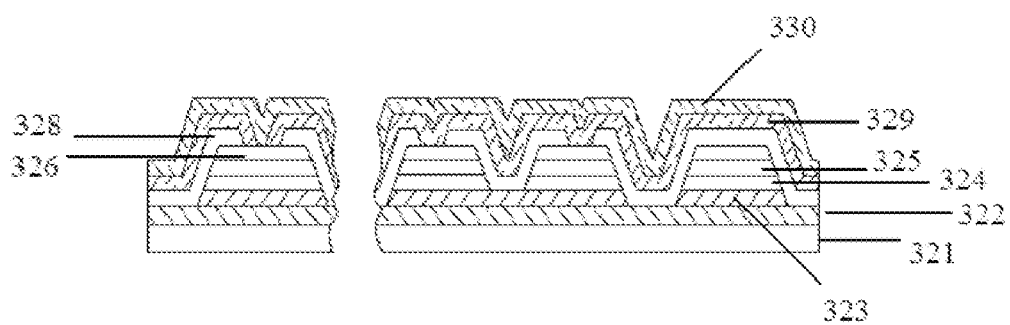
Figure 9:
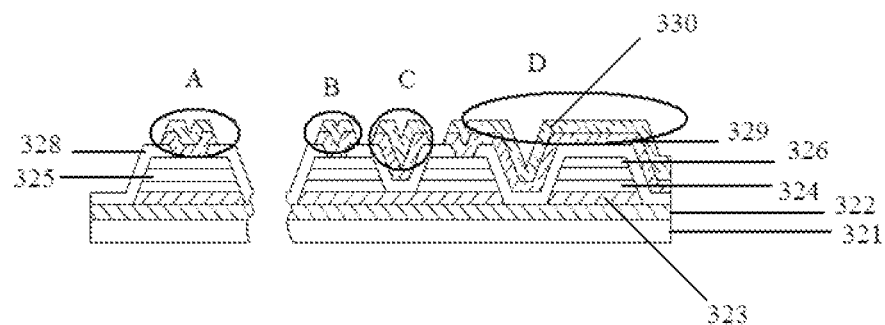
Figure 10:
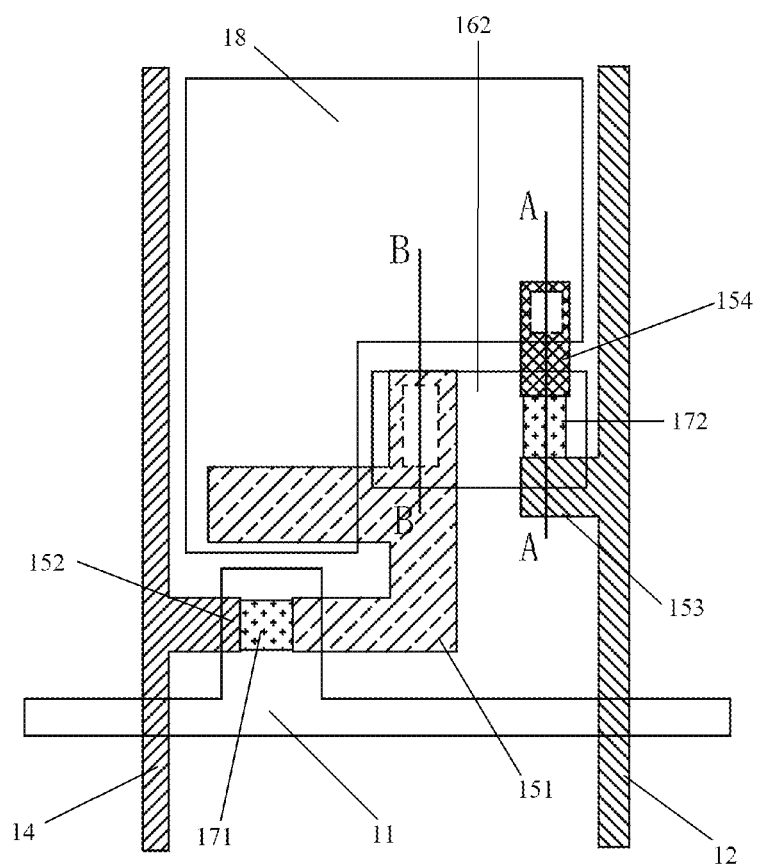
FIG. 10 is a schematic plan view of an array substrate according to the embodiments of the disclosure.
Figure 11:
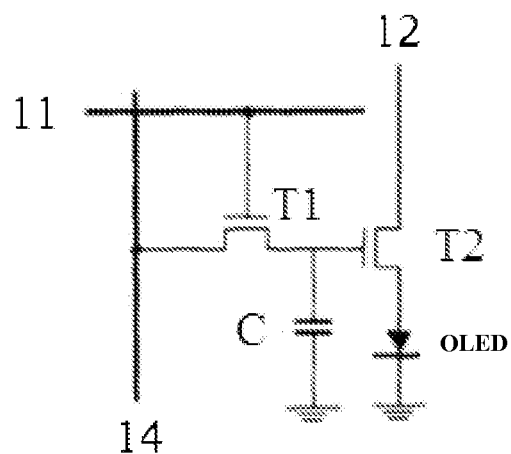
FIG. 11 is an equivalent circuit diagram of the array substrate shown in FIG. 10.

FIG. 1 to FIG. 9 are cross-sectional views taken along line B-B and line A-A in FIG. 10, and illustrate the fabrication method of the array substrate according to the embodiments of the disclosure. FIG. 10 is a schematic plan view of an array substrate according to the embodiments of the disclosure. FIG. 11 is an equivalent circuit diagram of the array substrate shown in FIG. 10. The cross-sectional view taken along line B-B in FIG. 10 corresponds to a region A in FIG. 9, and the cross-sectional view taken along line A-A in FIG. 10 corresponds to regions B, C and D in FIG. 9.

As shown in FIG. 10, the array substrate of the OLED display comprises a data line 14, a power line 12 and a gate line 11. The data line 14 and the power line 12 are perpendicular to the gate line 11; and the data line 14 and the power line 12 intersect with two adjacent gate lines 11 to define one pixel region. A first thin film transistor T1 (also known as a switching thin film transistor) serving as an addressing component, a second thin film transistor T2 (also known as a driving thin film transistor) for controlling an organic light-emitting diode, and a pixel electrode are formed in the pixel region. FIG. 11 is an equivalent circuit diagram of the array substrate shown in FIG. 10. As shown in FIG. 10 and FIG. 11, the first thin film transistor T1 has a source electrode connected with the data line 14, a gate electrode connected with the gate line 11, and a drain electrode connected with a gate electrode of the second thin film transistor T2. The second thin film transistor T2 has a source electrode connected with the power line 12, and a drain electrode connected with the pixel electrode.

The fabrication method of the array substrate of the OLED display device comprises: forming active layers, source electrodes and drain electrodes in the first thin film transistor and the second thin film transistor by a single patterning process.

It should be noted that, the patterning process mentioned in the embodiments of the disclosure comprises processes of coating photoresist, exposing, developing, etching, and stripping photoresist, and as an example, the positive photoresist is employed.

For example, the fabrication method of the array substrate comprises the following steps.

Step 1: forming a buffer layer 322 on a substrate 321.

For example, the substrate 432 is a glass substrate. The buffer layer 322 for example is configured for preventing the defects caused by direct contact of the substrate 321 and a semiconductor layer.

Step 2: forming active layers, source electrodes and drain electrodes in the first thin film transistor and the second thin film transistor by a single patterning process on the substrate after the step 1.

For example, the active layer comprises an intrinsic semiconductor layer and a doped semiconductor layer. Here, the case where the active layer comprises the intrinsic semiconductor layer and the doped semiconductor layer is described as an example. However, the embodiments of the disclosure are not limited thereto. For example, the active layer may only comprise the intrinsic semiconductor layer.

For example, a source-drain protective layer is further provided on the source electrodes and the drain electrodes, and is formed in this step as well.

For example, the above-mentioned step 2 further comprises the following steps.

Figure 1:
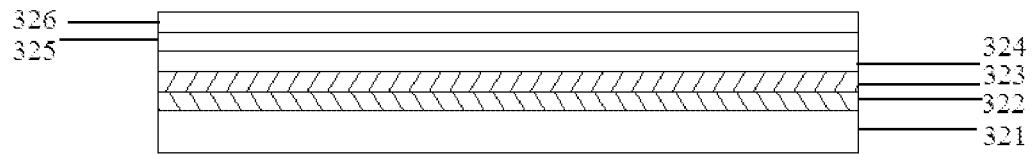
FIG. 1 to FIG. 9 are cross-sectional views taken along line B-B and line A-A in FIG. 10, and illustrating a fabrication method of an array substrate according to embodiments of the disclosure.

Step 201: depositing the intrinsic semiconductor layer 323, the doped semiconductor layer 324 (the intrinsic semiconductor layer 323 and the doped semiconductor layer 324 are collectively referred to as an active layer film), a source-drain metal layer 325 and a source-drain protective layer 326 on the substrate after the step 1, as shown in FIG. 1.

The source-drain protective layer 326 for example is of a single-layer structure, a dual-layer structure or a multilayer structure. With the dual-layer structure as an example, the first layer for example is made of titanium and copper alloy, copper nitride, Ti or TiSi. Or, the first layer for example is made of molybdenum, niobium, molybdenum and niobium alloy, magnesium and aluminum alloy, molybdenum and titanium alloy or titanium. The second layer for example is made of MoSiNx, silicon and titanium alloy or titanium nitride, wherein the N element may be replaced with elements such as Cl and P and other elements with identical or similar characteristics. Or, the second layer for example is made of molybdenum, molybdenum and niobium alloy, magnesium and aluminum alloy, molybdenum and titanium alloy or titanium.

Step 202: coating a photoresist 327 on the source-drain protective layer 326.

Figure 2:
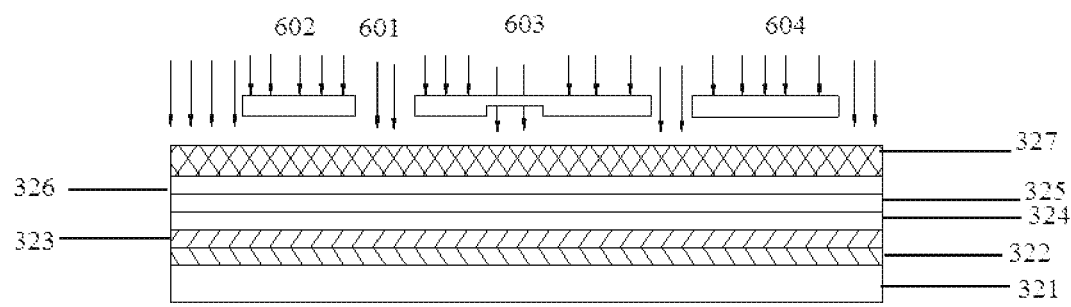
Figure 3:
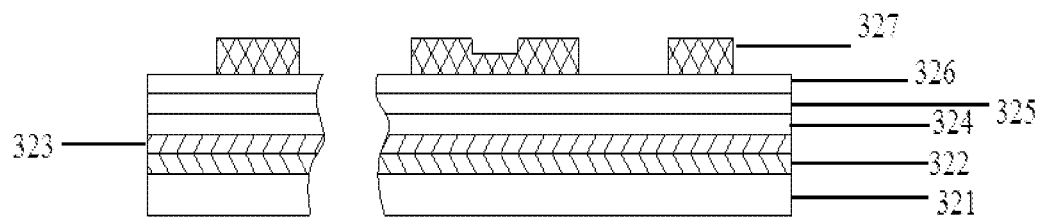

Step 203: exposing and developing by using a dual-tone mask, wherein a connection region (see a region A in FIG. 9) of the drain electrode of the first thin film transistor and the gate electrode of the second thin film transistor, regions (not shown in FIG. 9) of the data line and the power line, regions (see a region B in FIG. 9) of the source electrode and the drain electrode of the first thin film transistor and the source electrode and the drain electrode of the second thin film transistor, and a region (see a region D in FIG. 9) of a storage capacitor are photoresist-completely-reserved regions, a first channel region of the first thin film transistor and a second channel region of the second thin film transistor (see a region C in FIG. 9) are photoresist-partially-reserved regions, and regions other than the above regions are photoresist-completely-removed regions, with reference to FIG. 2 and FIG. 3.

Figure 4:
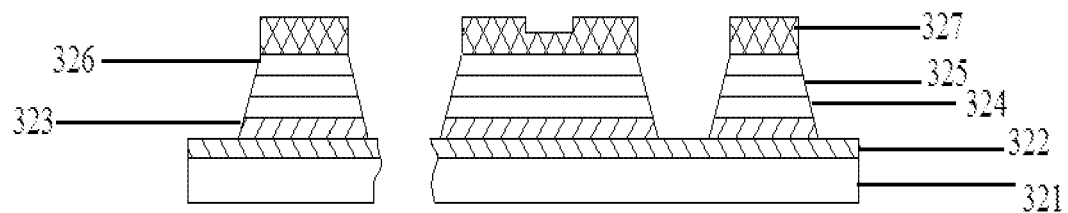

Step 204: removing the source-drain protective layer, the source-drain metal layer, and the active layer film corresponding to the photoresist-completely-removed regions by a first etching process, that is, the etching process is performed until the buffer layer 322, with reference to FIG. 4.

Figure 5:
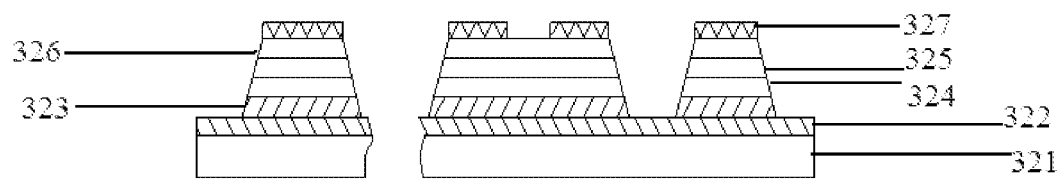

Step 205: removing the photoresist corresponding to the photoresist-partially-reserved regions by an ashing process, and forming the first channel region and the second channel region, with reference to FIG. 5.

Step 206: removing the doped semiconductor layer 324, the source-drain metal layer 325 and the source-drain protective layer 326 corresponding to the photoresist-partially-reserved regions by a second etching process.

Figure 6:
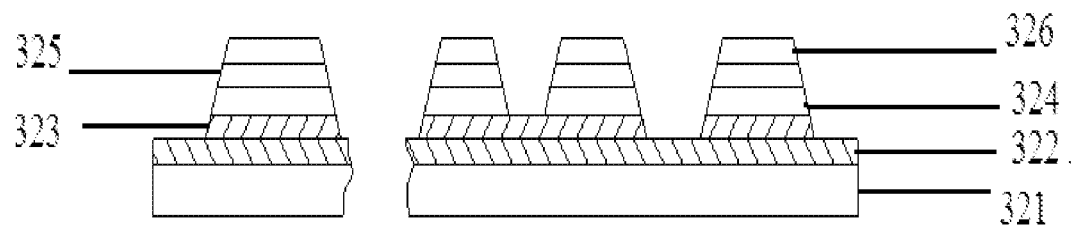

It should be noted that, if no doped semiconductor layer 324 is provided in practical production, only the source-drain metal layer 325 and the source-drain protective layer 326 are required to be removed, that is, the second etching process is performed until the intrinsic semiconductor layer, with reference to FIG. 6.

Step 7: stripping remaining photoresist, and forming a pattern of the connection region of the drain electrode of the first thin film transistor and the gate electrode of the second thin film transistor, the data line and the power line, the source electrodes and the drain electrodes of the first thin film transistor and the second thin film transistor, and a pattern of the region of the storage capacitor, with further reference to FIG. 6.

For example, the intrinsic semiconductor layer is made of one or more of IGZO, ITZO, IZO, $Cu_2O$, GZO, AZO, HfIZO and ZnON, and the doped semiconductor layer is made of one or more of amorphous silicon, polycrystalline silicon and microcrystalline silicon.

In one example, in the case that the active layer is made of the oxide semiconductor layer, the oxide semiconductor layer for example is plasma-processed under different atmospheres, and these atmospheres for example is oxygen, argon, nitric oxide (NO), hydrogen, or any other gases capable of performing surface modification on the oxide semiconductor material. For example, the oxide semiconductor layer is processed in air by a hydrogen plasma.

In one example, in the case that the active layer is made of the oxide semiconductor layer, the oxide semiconductor layer for example is annealed under nitrogen, oxygen or air. For example, the annealing temperature is 200° C. to 500° C., and the annealing environment is air, oxygen, nitrogen, air containing 1-10% water vapor or oxygen containing 1-10% water vapor.

Figure 7:
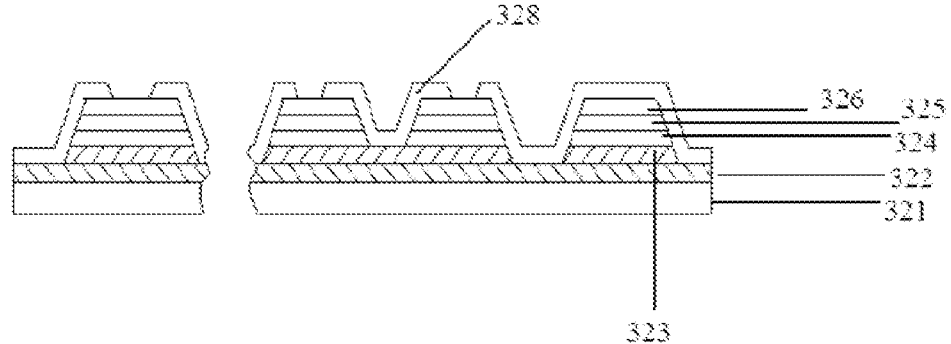

Step 3: forming a gate insulating layer 328 on the substrate after the step 2, and forming a via hole by a patterning process, with reference to FIG. 7.

For example, the gate insulating layer is of a single-layer structure, and the gate insulating layer is made of one of silicon oxide thin film, aluminum oxide thin film, titanium oxide thin film, silicon oxynitride thin film, zirconium oxide thin film, tantalum oxide thin film, barium titanate thin film, neodymium oxide thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film.

For example, the gate insulating layer is of a dual-layer structure, that is, the gate insulating layer comprises a first gate insulating layer and a second gate insulating layer; the first gate insulating layer is positioned in proximity to a gate electrode layer, and the second gate insulating layer is positioned in proximity to the active layer; the first gate insulating layer is made of one of silicon oxynitride thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; and the second gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film.

For example, the gate insulating layer is of a triple-layer structure, that is, the gate insulating layer comprises a third gate insulating layer, a fourth gate insulating layer and a fifth gate insulating layer; the third gate insulating layer is positioned in proximity to the gate electrode layer, the fifth gate insulating layer is positioned in proximity to the active layer, and the fourth gate insulating layer is positioned between the third gate insulating layer and the fifth gate insulating layer; the third gate insulating layer is made of one of silicon nitride thin film, aluminum nitride thin film, zirconium nitride thin film and tantalum nitride thin film; the fourth gate insulating layer is made of one of silicon oxynitride thin film, aluminum oxynitride thin film, zirconium oxynitride thin film, tantalum oxynitride thin film and neodymium oxynitride thin film; and the fifth gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film.

For example, the gate insulating layer of the above-mentioned structures is annealed. For example, the annealing comprises: performing a dehydrogenation process on the gate insulating layer in an annealing chamber of a PECVD apparatus under an atmosphere of nitrogen or air. For example, a temperature of the annealing chamber is 200° C. to 350° C., and an annealing time is 15 min to 90 min.

Step 4: forming the gate electrode of the first thin film transistor, the gate electrode of the second thin film transistor, the gate line and the pixel electrode by a single patterning process.

With reference to FIG. 8, a metal material layer 329 and a transparent electrode material layer 330 are sequentially deposited on the substrate after the step 3, the gate electrode of the first thin film transistor, the gate electrode of the second thin film transistor, the gate line and the pixel electrode are formed by the single patterning process, so as to complete the fabrication of the main body of the array substrate, with reference to FIG. 9.

The etching process described in the above steps for example is a wet etching, a dry etching or a combination of the wet etching and the dry etching.

It should be noted that the fabrication method of the array substrate comprising two thin film transistors as described above is also applicable to a fabrication method of an array substrate comprising one thin film transistor or more thin film transistors.

The embodiments of the disclosure further provide an array substrate. The array substrate comprises a gate line and a data line, and a first thin film transistor and a pixel electrode are provided in a pixel region defined by intersecting the gate line with the data line. An active layer, a source electrode and a drain electrode of the first thin film transistor are formed by a single patterning process.

For example, the array substrate is the array substrate of an OLED display device. As shown in FIG. 9 to FIG. 11, the array substrate of the OLED display comprises a data line 14, a power line 12 and a gate line 11. The data line 14 and the power line 12 are perpendicular to the gate lines 11, and the data line 14 and the power line 12 intersect with two adjacent gate lines 11 to define one pixel region. A first thin film transistor T1 (also known as a switching thin film transistor) serving as an addressing component, a second thin film transistor T2 (also known as a driving thin film transistor) for controlling an organic light-emitting diode and a pixel electrode are formed in the pixel region.

The first thin film transistor is positioned at an intersection of the gate line 11 and the data line 14, and the second thin film transistor is positioned at an intersection of the gate line 11 and the power line 12. The active layers, the source electrodes and the drain electrodes of the first thin film transistor and the second thin film transistor are formed by a single patterning process. The first thin film transistor comprises a first active layer 171, a first source electrode 152, a first drain electrode 151 and a first gate electrode 161. The second thin film transistor comprises a second active layer 172, a second source electrode 153, a second drain electrode 154 and a second gate electrode 162.

The array substrate further comprises a buffer layer, and the first thin film transistor and the second thin film transistor are formed on the buffer layer. Further, the active layers, the source electrodes and the drain electrodes of the first thin film transistor and the second thin film transistor are formed on the buffer layer.

The array substrate further comprises a gate insulating layer. The gate insulating layer covers the active layers, the source electrodes and the drain electrodes of the first thin film transistor and the second thin film transistor. Moreover, a via hole is provided in the gate insulating layer.

The gate electrodes of the first thin film transistor and the second thin film transistor, the pixel electrode and the gate line are provided on the gate insulating layer. The gate electrodes of the first thin film transistor and the second thin film transistor, the pixel electrode and the gate line are formed by a single patterning process. The first gate electrode 161 is connected with the gate line, the second gate electrode 162 is not connected with the gate line 11, and the first gate electrode 161 is not connected with the second gate electrode 162.

The first drain electrode 151 of the first thin film transistor is connected with the second gate electrode 162 of the second thin film transistor through the via hole of the gate insulating layer. The second drain electrode 153 of the second thin film transistor is connected with the pixel electrode through the via hole of the gate insulating layer.

For example, the source-drain metal layer is made of one or more of copper, copper alloy, MO, MO-Al-MO alloy, MO/Al-Nd/Mo stacked structure, AL, AL alloy and MO/Nd/Cu/Ti/Cu alloy.

It should be noted that the source electrode and the drain electrode of the thin film transistor are determined by the flowing direction of current. For the sake of convenience of description in the embodiments of the disclosure, the electrode connected with the pixel electrode is referred to as the drain electrode. The channel region is a region between the source electrode and the drain electrode.

For example, the gate insulating layer is of a single-layer structure, and the gate insulating layer is made of one of silicon oxide thin film, aluminum oxide thin film, titanium oxide thin film, silicon oxynitride thin film, zirconium oxide thin film, tantalum oxide thin film, barium titanate thin film, neodymium oxide thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film. In order to obtain better performances of the device, an annealing process is performed on the gate insulating layer, so as to reduce the influence of the hydrogen element and the compound comprising hydrogen in the gate insulating layer on the performances of the oxide semiconductor layer.

For example, the gate insulating layer is of a dual-layer structure, that is, the gate insulating layer comprises a first gate insulating layer and a second gate insulating layer; the first gate insulating layer is positioned in proximity to the gate electrode, and the second gate insulating layer is positioned in proximity to the active layer; the first gate insulating layer is made of one of silicon oxynitride thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; and the second gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film. The first gate insulating layer and/or the second gate insulating layer for example is annealed. The first gate insulating layer inhibits the defects caused by the metal of the gate electrode (especially when the gate electrode is made of copper or a copper alloy) diffusing into the active layer. The second gate insulating layer has a function of implementing good matching with the oxide semiconductor layer so as to improve the performances of the device. Because the second gate insulating layer is mostly made of oxide insulating layer and its ability of preventing groups of H+, OH− and the like from diffusing is poor, the first gate insulating layer needs to be treated by an annealing process after it is formed to reduce groups of H+, OH− and the like possibly diffusing in the first gate insulating layer and further to improve the stability of the device.

For example, the gate insulating layer is of a triple-layer structure, that is, the gate insulating layer comprises a third gate insulating layer, a fourth gate insulating layer and a fifth gate insulating layer; the third gate insulating layer is positioned in proximity to the gate electrode, the fifth gate insulating layer is positioned in proximity to the active layer, and the fourth gate insulating layer is positioned between the third gate insulating layer and the fifth gate insulating layer; the third gate insulating layer is made of one of silicon nitride thin film, aluminum nitride thin film, zirconium nitride thin film and tantalum nitride thin film; the fourth gate insulating layer is made of one of silicon oxynitride thin film, aluminum oxynitride thin film, zirconium oxynitride thin film, tantalum oxynitride thin film and neodymium oxynitride thin film; and the fifth gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film.

The third gate insulating layer is made of inorganic insulating materials such as silicon nitride; these inorganic insulating materials cause the performance of the oxide semiconductor layer to be degraded when being in direct contact with the oxide semiconductor layer, but these insulating materials better inhibit the defect caused by the metal of the gate electrode (especially when the gate electrode is made of copper or a copper alloy) diffusing into the active layer, so the third gate insulating layer is positioned in proximity to the gate electrode and is far away from the active layer. The fourth gate insulating layer is provided as an intermediate layer. Because the fourth gate insulating layer made of inorganic insulating materials such as silicon oxynitride thin film contains less groups of H+, OH– and the like and has a certain anti-permeation capability for the groups such as H+, OH– and the like, the fourth gate insulating layer better inhibit the groups such as H+, OH– and the like from diffusing into the oxide semiconductor layer so that the stability of the device is improved. Meanwhile, in order to further improve the performances of the device, the fifth gate insulating layer is in direct and close contact with the oxide semiconductor layer, so as to better match with the oxide semiconductor and to improve the stability of the device.

The embodiments of the disclosure further provide a display device, and the display device comprises the above array substrate. The display device may be any product or component having a display function, such as a liquid crystal display panel, an E-paper, an OLED panel, a mobile phone, a tablet personal computer, a television, a display, a notebook computer, a digital photo frame, a navigator and the like.

The foregoing embodiments merely are exemplary embodiments of the disclosure, and not intended to define the scope of the disclosure, and the scope of the disclosure is determined by the appended claims.

The present application claims priority of Chinese Patent Application No. 201410003674.7 filed on Jan. 3, 2014, the disclosure of which is incorporated herein by reference in its entirety as part of the present application.

What is claimed is:
1. A fabrication method of an array substrate, the array substrate comprising a data line and a gate line, the data line and the gate line intersecting with each other to define a pixel region, and the pixel region comprising a first thin film transistor and a pixel electrode, wherein the method comprises:
forming an active layer film and a source-drain metal layer on a substrate, and forming an active layer, a source electrode and a drain electrode of the first thin film transistor by a single patterning process.
2. The fabrication method of the array substrate according to claim 1, wherein
the array substrate further comprises a second thin film transistor and a power line, and the active layers, the source electrodes and the drain electrodes of the first thin film transistor and the second thin film transistor are formed by the single patterning process.
3. The fabrication method of the array substrate according to claim 2, wherein
after forming the active layers, the source electrodes and the drain electrodes of the first thin film transistor and the second thin film transistor, the method further comprises:
forming a gate insulating layer on the substrate and forming a via hole in the gate insulating layer; and
forming gate electrodes of the first thin film transistor and the second thin film transistor, the gate line and the pixel electrode by a single patterning process.
4. The fabrication method of the array substrate according to claim 3, wherein
the forming the active layers, the source electrodes and the drain electrodes of the first thin film transistor and the second thin film transistor by the single patterning process comprises:
coating a photoresist on the source-drain metal layer;
exposing and developing by using a dual-tone mask, wherein a connection region of the drain electrode of the first thin film transistor and the gate electrode of the second thin film transistor, regions of the data line and the power line, and regions of the source electrodes and the drain electrodes of the first thin film transistor and the second thin film transistor are photoresist-completely-reserved regions, a first channel region of the first thin film transistor and a second channel region of the second thin film transistor are photoresist-partially-reserved regions, and regions other than the above regions are photoresist-completely-removed regions;
removing the source-drain metal layer and the active layer film corresponding to the photoresist-completely-removed regions by a first etching process;
removing the photoresist corresponding to the photoresist-partially-reserved-regions by an ashing process, and forming the first channel region and the second channel region;
removing the source-drain metal layer corresponding to the photoresist-partially-reserved regions by a second etching process; and
stripping remaining photoresist, and forming a pattern of the connection region of the drain electrode of the first thin film transistor and the gate electrode of the second thin film transistor, the data line and the power line, the source electrodes and the drain electrodes of the first thin film transistor and the second thin film transistor.
5. The fabrication method of the array substrate according to claim 3, wherein the gate insulating layer is processed by an annealing process.
6. The fabrication method of the array substrate according to claim 5, wherein
the gate insulating layer is of a single-layer structure, and the gate insulating layer is made of one of silicon oxide thin film, aluminum oxide thin film, titanium oxide thin film, silicon oxynitride thin film, zirconium oxide thin film, tantalum oxide thin film, barium titanate thin film, neodymium oxide thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; or the gate insulating layer is of a dual-layer structure, that is, the gate insulating layer comprises a first gate insulating layer and a second gate insulating layer; the first gate insulating layer is positioned in proximity to a gate electrode layer, and the second gate insulating layer is positioned in proximity to the active layer; the first gate insulating layer is made of one of silicon oxynitride thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; and the second gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film; or the gate insulating layer is of a triple-layer structure, that is, the gate insulating layer comprises a third gate insulating layer, a fourth gate insulating layer and a fifth gate insulating layer; the third gate insulating layer is positioned in proximity to the gate electrode layer, the fifth gate insulating layer is positioned in proximity to the active layer, and the fourth gate insulating layer is positioned between the third gate insulating layer and the fifth gate insulating layer; the third gate insulating layer is made of one of silicon nitride thin film, aluminum nitride thin film, zirconium nitride thin film and tantalum nitride thin film; the fourth gate insulating layer is made of one of silicon oxynitride thin film, aluminum oxynitride thin film, zirconium oxynitride thin film, tantalum oxynitride thin film and neodymium oxynitride thin film; and the fifth gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film.

7. The fabrication method of the array substrate according to claim 1, wherein
the active layer comprises an intrinsic semiconductor layer and/or a doped semiconductor layer;
the intrinsic semiconductor layer is made of one or more of IGZO, ITZO, IZO, $Cu_2O$, GZO, AZO, HfIZO and ZnON; and
the doped semiconductor layer is made of one or more of amorphous silicon, polycrystalline silicon and microcrystalline silicon.

8. The fabrication method of the array substrate according to claim 7, wherein
in the case that the active layer is made of an oxide semiconductor layer, the oxide semiconductor layer is plasma-processed under different atmospheres.

9. The fabrication method of the array substrate according to claim 7, wherein
in the case that the active layer is made of an oxide semiconductor layer, the oxide semiconductor layer is annealed under nitrogen, oxygen or air.

10. The fabrication method of the array substrate according to claim 9, wherein an annealing temperature is 200° C. to 500° C.

11. The fabrication method of the array substrate according to claim 1, wherein
a source-drain protective layer is further provided on the source electrode and the drain electrode, and the source-drain protective layer, the source electrode, the drain electrode and the active layer are formed by the single patterning process.

12. The fabrication method of the array substrate according to claim 3, wherein
the forming the gate electrodes and the pixel electrode by the single patterning process comprises:
sequentially forming a metal material layer and a transparent electrode material layer on the substrate having the gate insulating layer, and forming the gate electrodes of the first thin film transistor and the second thin film transistor, the gate line and the pixel electrode by a patterning process.

13. The fabrication method of the array substrate according to claim 9, further comprising:
forming a buffer layer on the substrate before forming the active layer, the source electrode and the drain electrode of the first thin film transistor.

14. An array substrate fabricated by using the fabrication method according to claim 1, comprising a substrate, and an active layer, a source electrode and a drain electrode, a gate insulating layer, a pixel electrode and a gate electrode which are formed on the substrate,
wherein the active layer, the source electrode and the drain electrode are formed by a single patterning process.

15. The array substrate according to claim 14, wherein
the gate electrode comprises a first gate electrode of a first thin film transistor and a second gate electrode of a second thin film transistor;
the active layer comprises a first active layer of the thin film transistor and a second active layer of the second thin film transistor;
the source electrode and the drain electrode comprise a first source electrode and a first drain electrode of the first thin film transistor and a second source electrode and a second drain electrode of the second thin film transistor.

16. The array substrate according to claim 14, wherein
the gate insulating layer is of a single-layer structure, and the gate insulating layer is made of one of silicon oxide thin film, aluminum oxide thin film, titanium oxide thin film, silicon oxynitride thin film, zirconium oxide thin film, tantalum oxide thin film, barium titanate thin film, neodymium oxide thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; or
the gate insulating layer is of a dual-layer structure, that is, the gate insulating layer comprises a first gate insulating layer and a second gate insulating layer; the first gate insulating layer is positioned in proximity to a gate electrode layer, and the second gate insulating layer is positioned in proximity to the active layer; the first gate insulating layer is made of one of silicon oxynitride thin film, aluminum oxynitride thin film, zirconium oxynitride thin film, tantalum oxynitride thin film, neodymium oxynitride thin film, silicon nitride thin film, aluminum nitride thin film, zirconium nitride thin film and tantalum nitride thin film; and the second gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film; or the gate insulating layer is of a triple-layer structure, that is, the gate insulating layer comprises a third gate insulating layer, a fourth gate insulating layer and a fifth gate insulating layer; the third gate insulating layer is positioned in proximity to the gate electrode layer, the fifth gate insulating layer is positioned in proximity to the active layer, and the fourth gate insulating layer is positioned between the third gate insulating layer and the fifth gate insulating layer; the third gate insulating layer is made of one of silicon nitride thin film, aluminum nitride thin film, zirconium nitride thin film and tantalum nitride thin film; the fourth gate insulating layer is made of one of silicon oxynitride thin film, aluminum oxynitride thin film, zirconium oxynitride thin film, tantalum oxynitride thin film and neodymium oxynitride thin film; and the fifth gate insulating layer is made of one of silicon oxide thin film, aluminum oxide thin film, titanium oxide thin film, silicon oxynitride thin film, zirconium oxide thin film, tantalum oxide thin film, barium titanate thin film and neodymium oxide thin film.

17. The array substrate according to claim 14, wherein the active layer comprises an intrinsic semiconductor layer and/or a doped semiconductor layer;

the intrinsic semiconductor layer is made of one or more of IGZO, ITZO, IZO, $Cu_2O$, GZO, AZO, HfIZO and ZnON; and the doped semiconductor layer is made of one or more of amorphous silicon, polycrystalline silicon and microcrystalline silicon.

18. The array substrate according to claim 14, wherein a source-drain protective layer is further provided on the source electrode and the drain electrode.

19. The array substrate according to claim 14, wherein a buffer layer is further provided under the active layer.

20. A display device, comprising the array substrate according to claim 14.

* * * * *